(12) United States Patent
Archbold et al.

(10) Patent No.: US 7,102,552 B1
(45) Date of Patent: Sep. 5, 2006

(54) DATA COMPRESSION WITH EDIT-IN-PLACE CAPABILITY FOR COMPRESSED DATA

(75) Inventors: John Archbold, Cupertino, CA (US); Alan Christopher Barker, San Lorenzo, CA (US); Boby John Anchanattu, Sunnyvale, CA (US)

(73) Assignee: WindSpring, Inc., San Jose, CA (US)

( * ) Notice: Subject to any disclaimer, the term of this patent is extended or adjusted under 35 U.S.C. 154(b) by 0 days.

(21) Appl. No.: 11/147,717

(22) Filed: Jun. 7, 2005

(51) Int. Cl.
*H03M 7/30* (2006.01)

(52) U.S. Cl. ............................. 341/87; 341/51; 341/50

(58) Field of Classification Search .................. 341/87, 341/50, 67; 708/203
See application file for complete search history.

(56) References Cited

U.S. PATENT DOCUMENTS

| | | | | |
|---|---|---|---|---|
| 5,151,697 | A * | 9/1992 | Bunton | 341/51 |
| 5,389,922 | A * | 2/1995 | Seroussi et al. | 341/51 |
| 5,703,581 | A * | 12/1997 | Matias et al. | 341/67 |
| 5,861,827 | A * | 1/1999 | Welch et al. | 341/51 |
| 5,951,623 | A * | 9/1999 | Reynar et al. | 708/203 |
| 6,121,901 | A * | 9/2000 | Welch et al. | 341/51 |
| 6,208,273 | B1 * | 3/2001 | Dye et al. | 341/51 |
| 6,611,213 | B1 * | 8/2003 | Bentley et al. | 341/51 |
| 6,798,362 | B1 * | 9/2004 | Modha | 341/51 |
| 6,879,266 | B1 * | 4/2005 | Dye et al. | 341/51 |

\* cited by examiner

*Primary Examiner*—Jean Bruner Jeanglaude
(74) *Attorney, Agent, or Firm*—Townsend and Townsend and Crew LLP (57) ABSTRACT

A method for encoding an input file into an output file that is compressed so that the number of bits required to represent the output file is less than the number of bits of the input file. The encoding method includes the parsing of the input file into a series of data items, the data items having an order and collectively corresponding to the input file. The encoding method compares the series of data items against a static dictionary having at least mappings between terminal sequence pointers and representations of data items. Each mapping has an associated length, the associated length for a mapping being the length of the data item pointed to by its terminal sequence pointer wherein the terminal sequence pointers are represented by a number of bits that is independent of the particular data items in the input file, the static dictionary being static such that the static dictionary is usable to provide a mapping between a terminal sequence pointer and its corresponding representation of data item independent of mapping of other data items. The encoding method adds to the output file an output file element that is a terminal sequence pointer for data items that map to entries in the static dictionary, each output file including at least one terminal sequence pointer. The encoding method adds to the output file an output file element that is a symbol sequence having one or more symbols for data items that are to be represented directly in the output file, and creates an element mapping for the output file to indicate, for each output file element, whether the output file element corresponds to a terminal sequence pointer or a symbol sequence.

18 Claims, 11 Drawing Sheets

EIP File header

| Magic Number | File Format Version | Codec Version | Flags | File decoded size (in bytes) | File encoded size (in bytes, including headers) | Block de-coded size | Dictionary CRC16 | CRC8 |
|---|---|---|---|---|---|---|---|---|
| | | | | | | | Dictionary name length + dictionary name (variable, 2 to 256 bytes) | |

804

File header for small (<= 32768 bytes) files

| Magic Number (12 bits) | File Format Version (4 bits) | Flags | File decoded size (in bytes) | File encoded size (in bytes, including headers) | Block decoded size | Dictionary CRC16 | CRC8 |
|---|---|---|---|---|---|---|---|
| | | | | | | Dictionary name length + dictionary name (variable, 2 to 256 bytes) | |

804a

File header for small (< 4096 bytes) files

| Magic Number (12 bits) | File Format Version (4 bits) | Flags | File decoded size (= block size) (in bytes) (12 bits) | File encoded size (in bytes, including headers) (12 bits) | Dictionary CRC16 | CRC8 |
|---|---|---|---|---|---|---|
| | | | | | Dictionary name length + dictionary name (variable, 2 to 256 bytes) | |

DATA COMPRESSION WITH EDIT-IN-PLACE CAPABILITY FOR COMPRESSED DATA

BACKGROUND OF THE INVENTION

The present invention relates in general to data compression techniques. In particular, the present invention relates to the manipulation of electronic data while the data is encoded for storage in a form that requires less storage space.

Data compression is used in most data storage systems in use today. Typical compression techniques analyze data in terms of bits. It is known that analyzing data in terms of bits destroys the information structure that is required to edit and search data fields.

The benefits of using a compression technology arise from the impact of compression on the size of the data. These benefits relate not only to the size of the stored data but also to the speed at which the data can be accessed.

Reduction in the stored data size is important in archival and mass storage systems. Document and record databases are typical of archival systems where commercial databases dominate the mass storage market. Reduction in the size of data in transmission systems is also important. Examples of on-line data systems, where data compression is used, include commercial network transmissions and some internet data links.

A desired feature for such known data compression techniques is the application of lossless data compression and decompression techniques, meaning that the data must be able to be exactly recovered from the compressed data. In these applications users are particularly sensitive to the error rates and error susceptibility of the data.

It is known that Huffman Coding is the basis for many of the commercially available compression programs. Huffman Coding begins with an analysis of the entire data set, and establishes the weight of each symbol in the set. Libraries of repeated data are then assembled, with frequent symbols encoded using less bits than less frequent symbols. Sequences of binary patterns that represent the data stream are replaced by a coded table of binary terms. The coded table is expanded based on the occurrence of new binary patterns. The original data is restored from this binary data stream and the embedded table.

Another known compression technique is the run length encoding technique ("RLE"). RLE compression schemes encode a data stream by replacing a repeating sequence of bytes with a count and the repeated byte.

Another very common compression technique involves the use of the Lempel-Ziv-Welch ("LZW") algorithm. LZW compression schemes encode a streaming byte sequence using a dynamic table. The dynamic table is embedded in the encoded data stream. LZW variants typically achieve better data compression than those available using either the RLE or Huffman encoding techniques.

Another encoding technique uses arithmetic coding. Arithmetic coding uses a probability line, 0-1, and assign to every symbol a range in this line based on its probability; the higher the probability, the higher the range which is assigned to the symbol. Once the ranges and the probability line have been defined, the encoding of the symbols is initiated, where a symbol defines where the output floating point number gets located.

In any data storage system, the data can be stored either unencoded or encoded. The stored data typically needs to be updated using operations such as locating particular data items in the storage system, inserting more data, deleting existing data and changing the data. When the stored data is unencoded such operations are trivial. However, when the data is stored as encoded data, these operations become more complex. For example, in order to move to a particular offset, data needs to be decoded first so that the decoded offset of the data can be calculated. In order to insert data, the original data needs to be decoded, the new data inserted, and then the resultant data encoded back into the data storage system. In order to delete data, the data to be deleted usually needs to be extracted from the encoded data, removed, and then the modified data re-encoded; and to change the data, the data to be changed usually needs to be extracted from the encoded data, changed, and then the modified data re-encoded. The need to first decode the data, manipulate it and then encode it again, adversely impacts the storage requirements and the speed of such data manipulations.

There is therefore a need for a data compression technology that allows for the manipulation of data in its compressed form without having to first uncompress the data.

BRIEF SUMMARY OF THE INVENTION

The present invention provides methods and systems that enable the manipulation of stored electronic data while it is encoded, and which provide for the seeking, searching, editing and transmission of encoded data without the need to decode the data. Data is therefore stored encoded, and does not need to be decoded completely in order to manipulate the data. The sequence dictionaries used to enable these operations may be stored with the encoded data or separately from the encoded data to provide storage and transmission efficiency. Furthermore, an indexing method is used to enable the efficient implementation of seek, search, edit and transmission systems.

In one aspect, the embodiments of the present invention provide a dictionary method for collecting the sequence identifiers into dictionaries which are either contained inside the encoded data (internal dictionary), stored separate from the encoded data (external dictionary) or combinations thereof. A common external dictionary may be used by many encoded data sets. A composite dictionary may be constructed and used which points to a sequence or set of sequences contained in other dictionaries.

In another aspect, the embodiments of the present invention provide a method for segmenting the encoded data into blocks to enable the encoded data to be manipulated. This segmentation method allows data blocks to completely contain the encoded data, partially contain the encoded data, or represent data that has been added to another block.

In yet another aspect, the embodiments of the present invention provide an indexing method to allow for access into a large encoded data item. This indexing method allows for locating blocks of data in the encoded data, for updating the location of the blocks within the encoded data, and managing the location of the blocks which represent changes to the encoded data. The indexing method in accordance with the embodiments of the present invention allows for locating individual data items in the encoded data block, for updating the location of the encoded data within the encoded data blocks, and managing the location of the exceptions within the encoded data blocks and on the block boundaries.

In addition, the indexing method in accordance with the embodiments of the present invention allows individual data items to be located relative to a current location either forward of the current location or previous to the current location. The indexing method allows optimization for different sizes of encoded data, and optimization for different encoded block sizes.

In one aspect, the present invention provides a method for conducting operations on encoded data with the minimum amount of decoding and encoding required when the encoded items are stored as sequence identifiers which maintain a one to one relationship to the original data. These sequence identifiers may be grouped according to the length of the sequence so that the decoded offset can be quickly calculated. These sequence identifiers can be deleted or inserted without affecting the integrity of the encoded sequences that precede or follow them. New data is represented in terms of these sequence identifiers or groups of these sequence identifiers. New data may be represented in terms of a new sequence identifier, or a mixture of existing sequence identifiers and a new sequence identifier. When no relationship exists between the new data and the sequence identifiers then the data is inserted literally as exceptions.

In a specific embodiment, the present invention provides an encoder for encoding an input file into an output file that is compressed wherein the number of bits required to represent the output file is less than the number of bits of the input file. The encoder has logic for reading data from the input file, parsing the input file into a series of data items, comparing the series of data items against a static dictionary comprising at least mappings between terminal sequence pointers and representations of data items wherein each mapping has an associated length, wherein the associated length for a mapping being the length of the data item pointed to by its terminal sequence pointer wherein the terminal sequence pointers are represented by a number of bits that is independent of the particular data items in the input file, the static dictionary being static wherein the static dictionary is usable to provide a mapping between a terminal sequence pointer and its corresponding representation of data item independent of mapping of other data items and the like. The encoder might also include logic to add to the output file an output file element that is a terminal sequence pointer for data items that map to entries in the static dictionary, each output file including at least one terminal sequence pointer, logic to add to the output file an output file element that is a symbol sequence comprising one or more symbols for data items that are to be represented directly in the output file, and logic to create an element mapping for the output file to indicate, for each output file element, whether the output file element corresponds to a terminal sequence pointer or a symbol sequence.

In systems wherein data is encoded as provided above, searching and editing can be provided without requiring decompression. For example, given a compressed file and a sequence of quantum units (e.g., bits, bytes, pixels, symbols, characters, etc.), the sequence can be mapped to a corresponding set of bits (or other storage unit) that represent the sequence in the compressed file. Thus, a compressed file can be searched for the existence of the sequence without requiring decompression by scanning the compressed file for the existence of the corresponding set. For editing involving replacing a sequence to be deleted, the corresponding set for the sequence to be deleted can be determined and located in the compressed file without requiring decompression or changes to other parts of the compressed files (other than possibly length fields or header information, etc.). Likewise, a corresponding set for a sequence to be added can be determined and inserted. In general, editing can be represented by at least one addition, at least one deletion, or a combination of more than one of those.

The following detailed description together with the accompanying drawings will provide a better understanding of the nature and advantages of the present invention.

DETAILED DESCRIPTION OF THE INVENTION

Definitions

Unless defined otherwise, all terms used herein have the meaning commonly understood by a person skilled in the art to which this invention pertains. The following terms have the meanings ascribed to them unless specified otherwise.

CODEC refers to the computer program that encodes and decodes data streams using the miniaturization method in accordance with the embodiments of the present invention.

CODEC Mode refers to the mode of the CODEC that determines whether the data is treated as a seed for the Quantum Block Dictionary, as data to be miniaturized, or as data to be de-miniaturized.

Quantum Block refers to the fundamental indivisible unit of information.

A Quantum Exception identifies data that is not able to be coded using entries from the Quantum Dictionary. Data is inserted literally using the Quantum Exception.

Quantum Folding is the process of mapping existing Quantum Block or Quantum Sequence values to data.

Quantum Pair refers to a pair of Quantum Blocks and/or Pairs, with certain values reserved for Quantum Exceptions.

Terminal Sequence refers to a Quantum Pair consisting of Quantum Pairs and/or Quantum Blocks Quantum Dictionary refers to the highest probability set of Quantum Pairs bounded by the selected number of allowed Quantum Blocks and Quantum Pairs. Quantum Exceptions allow for data that is not available from the Quantum Dictionary.

Terminal Sequence Dictionary refers to a dictionary of pointers into a Quantum Dictionary consisting entirely of Terminal Sequences.

Overview

In accordance with the embodiments of the present invention, in a miniaturized data representation system, data input to the data storage system is encoded. Data is encoded using sequence pointers that represent the input data. Each sequence pointer represents some sequence of input data. The data representation may not be aware of the data type or the data length. The concept of a quantum block is used to isolate the data type from the dataset. Quantum blocks are used to identify the smallest piece of information that describes the dataset. Quantum blocks retain the information that is contained in the structure (type and length) of the data.

A sequence of quantum blocks is stored in a dictionary. A pointer to the location of this data is stored in a sequence table. A sequence pointer points to the location of a pointer in this table. An additional dictionary can also be constructed that contains a series of pointers from the sequence table. A pointer to the location of this data (series of pointers) is stored in another sequence table. When no further sequences can be discovered in the dataset, a terminal sequence is identified. The terminal sequence pointer, used to encode the data, points to a location in the sequence tables. Once constructed, this table of terminal sequences is called a terminal sequence dictionary.

Through this hierarchical structure, a one to one relationship is maintained between data in the encoded data set and the original data set, thus retaining the ability to seek, search, edit and transmit the encoded data. When data is not in the terminal sequence dictionary it is encoded as exception data.

The encoding system in accordance with the embodiments of the present invention is independent of the data source and can be file, stream or network based.

When data is encoded using methods in accordance with the embodiments of the present encoding system, various schemes provide the mechanisms to seek, search, edit, and transmit the encoded data without fully decoding the data.

In addition, by ordering the sequences according to the length of the original data and providing a mechanism for handling exceptions, seek operations can be undertaken without decoding. Seek operations can be performed relative to the current location in the data in either a forward or a backward direction.

By using an indexing scheme based on blocks of encoded data, data can be added to or deleted from blocks of encoded data. Edit data can be terminal sequences or exceptions. Edited data can also be appended as additional edit blocks of data.

The terminal sequence dictionaries can be included with the encoded data or maintained external to and separate from the encoded data. Additionally, a mixture of both internal and external terminal sequence dictionaries is provided. In addition, a new set of sequence pointers can be created in a table to identify both the terminal sequence dictionary and a terminal sequence subset within one or multiple terminal sequence dictionaries. In some cases, one terminal sequence dictionary can have multiple terminal sequence subsets, so that multiple identifications of terminal sequence subsets might identify terminal sequence subsets within one or multiple terminal sequence dictionaries.

Figure 1:
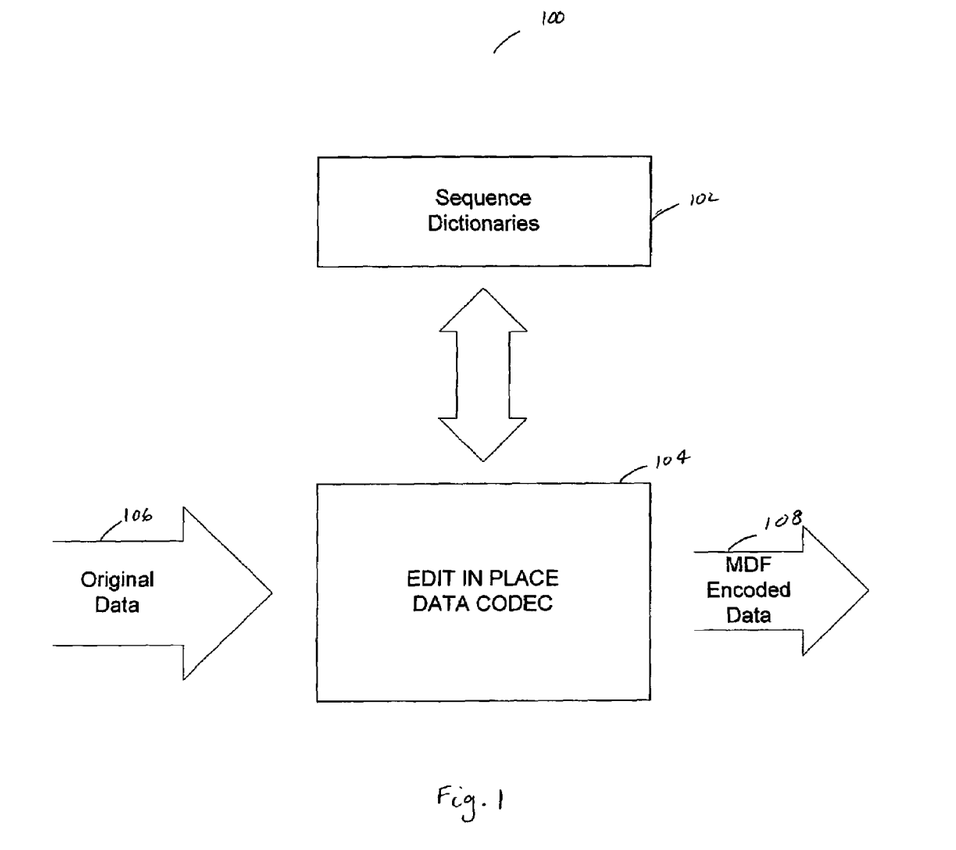
FIG. 1 is an exemplary overview block diagram of the data miniaturization technique ("DMT") in accordance with one embodiment of the present invention.

FIG. 1 is an exemplary overview block diagram 100 of the data miniaturization technique ("DMT") in accordance with one embodiment of the present invention. DMT derives its unique storage and speed advantages from its ability to miniaturize data to a fraction of its original size, and then enable the high-speed seek, search, edit and display of that data in its miniaturized state. One aspect of this data miniaturization capability resides in the combination of various novel schemes, including quantum pairing, multi-index pointer and exception handling techniques, as described in further detail below. In general, the steps in an exemplary DMT data miniaturization include the following sub-steps, namely: sequence dictionary selection 102, encoding/decoding via the Edit-in-Place codec 104, and seek, search, edit and display. Using these schemes, original data 106 gets processed by the Edit-in-Place codec 104 in combination with the sequence dictionaries 102 to produce MDF encoded data 108 for storage, transmission, display and further processing.

During the selection of sequence dictionary step, the input map data file (or stream) 106 is analyzed by the codec 104. An appropriate sequence dictionary is then either: selected from an existing custom dictionary; created for the first time, following analysis of the input data; adapted from an existing dictionary; or learned over time, based on the changing characteristics of input data.

During the encoding step, input data 106 is transformed by the Codec 104 to create a Miniaturized Index File ("MIF") in the Miniaturized (or Micro) Data Format ("MDF") 108 representation of the original data. This output data 108 is an encoded series of recurring sequences, and is a fraction of the size of the original file or stream.

For the seek, search, edit and display operations, the MDF data 108 operates with the sequence dictionary 102 and the codec 104 to perform high speed seek, search, edit and display of any data element within the encoded data.

The DMT schemes may be implemented to interface with most major mobile operating systems, including the Windows™ operating system, the Linux™ operating system, the Pocket PC™ operating system, Qualcomm's BREW™ operating system and operating systems provided by Symbian™/Nokia™. DMT may be applied to accelerate text, database, XML, HTML, raster image and vector-based mapping applications accessed and stored on storage networks, distributed clients and mobile devices.

Figure 2:
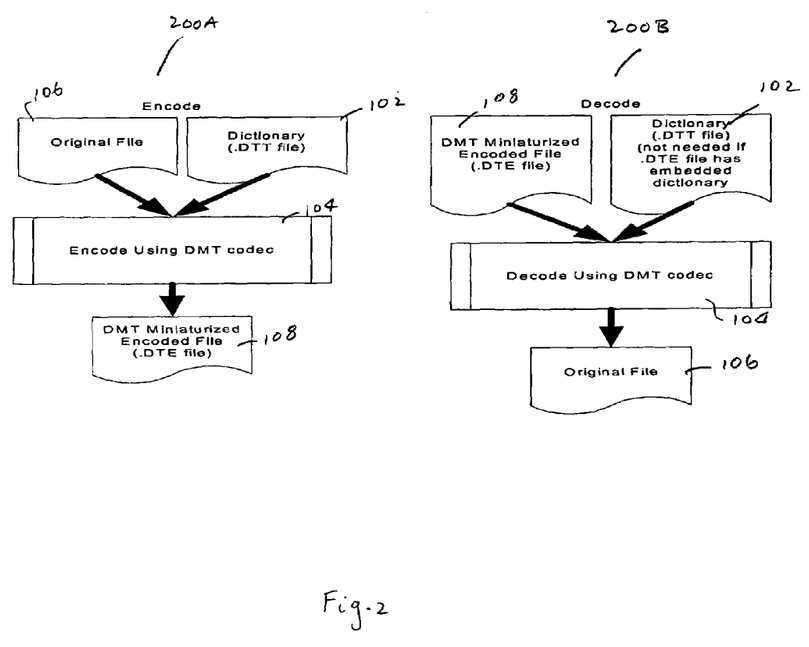
FIG. 2 is an exemplary block diagram of the processes that manipulate miniaturized data format ("MDF") data, in accordance with one embodiment of the present invention.

FIG. 2 is an exemplary block diagram of the processes 200A and 200B that encode and decode, respectively, miniaturized data format ("MDF") data, in accordance with one embodiment of the present invention. During the encoding process 200A, the original data file 106 is processed along with the dictionary 102 and the codec 104 to generate the encoded file 108. During the decoding process, encoded data 108 is processed with the dictionary 102 and the codec 104 to form the original file 106. In cases where the encoded file includes an internal dictionary, an external dictionary file is not used. The embodiments of the present invention encapsulate the dictionaries, data and indexing system into a method that allows seek, search, edit, and transmission of the data.

Figure 3:
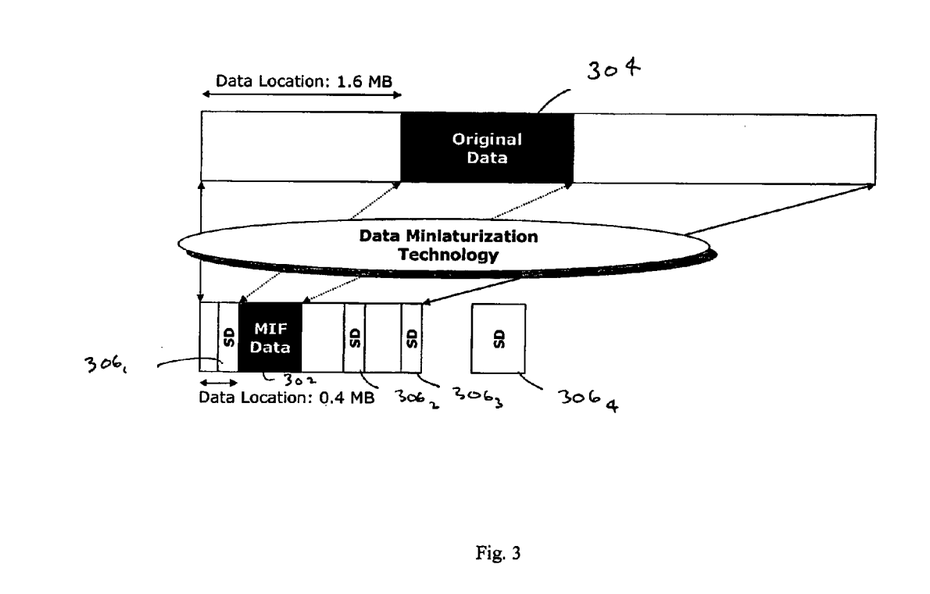
FIG. 3 is en exemplary block diagram of the relationship of MDF data to the original data, in accordance with one embodiment of the present invention.

FIG. 3 is en exemplary block diagram of the relationship of MDF data to the original data, in accordance with one embodiment of the present invention. A characteristic of an MDF dataset is that it retains a one to one relationship between the encoded data 302 and the original data 304. FIG. 3 also shows that one embodiment of the encoded file includes the encoded data 302 as well as a sequence dictionaries $306_1$ to $306_N$. This relationship maintains a unique link between the encoded index used to represent the data and the dictionary or dictionaries used to create this index.

Figure 4:
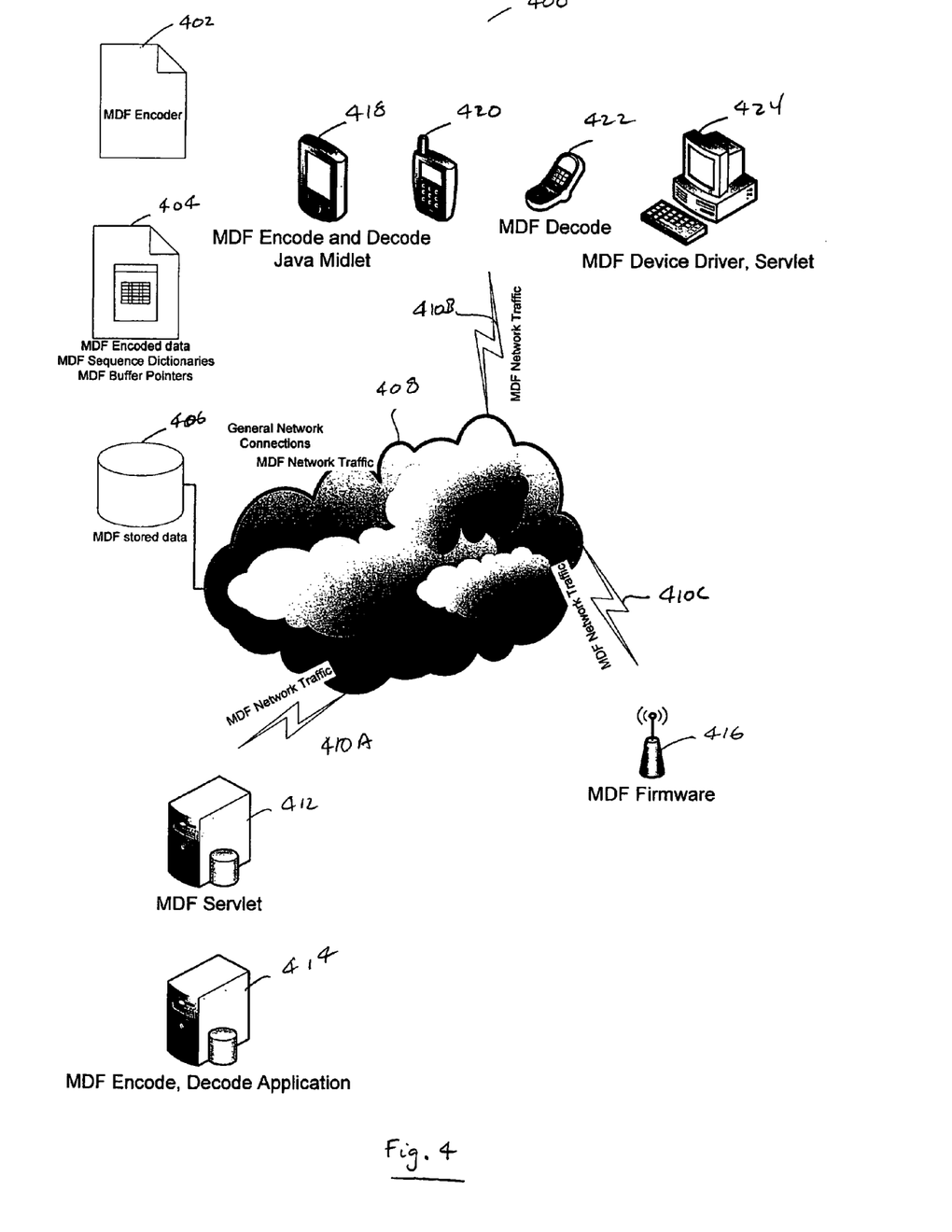
FIG. 4 is an exemplary block diagram of a typical end to end system that may be configured to use the MDF data in accordance with one embodiment of the present invention.

FIG. 4 is an exemplary block diagram 400 of a typical end to end system that may be configured to use the MDF data in accordance with one embodiment of the present invention. Shown in FIG. 4, an MDF encoder 402 generates the MDF data, one or more sequence dictionaries and one or more MDF buffer pointers 404, which are then stored as MDF stored data 406 in a database. The database is in communication with a network 408. Using the communication network 408, MDF network traffic 410A, 410B, 410C, enables communication between the database 406, one or more MDF servlets 412, one or more MDF codec applications 414, one or more MDF firmware 416, and various handheld or desktop devices 418–424. For example, device 418 used a Java Midlet codec to encode data in the MDF form and communicate the MDF data to device 420, or 422, which in turn receive, store, display, and modify the MDF data and exchange the modified data with other devices (e.g. 424).

Figure 5:
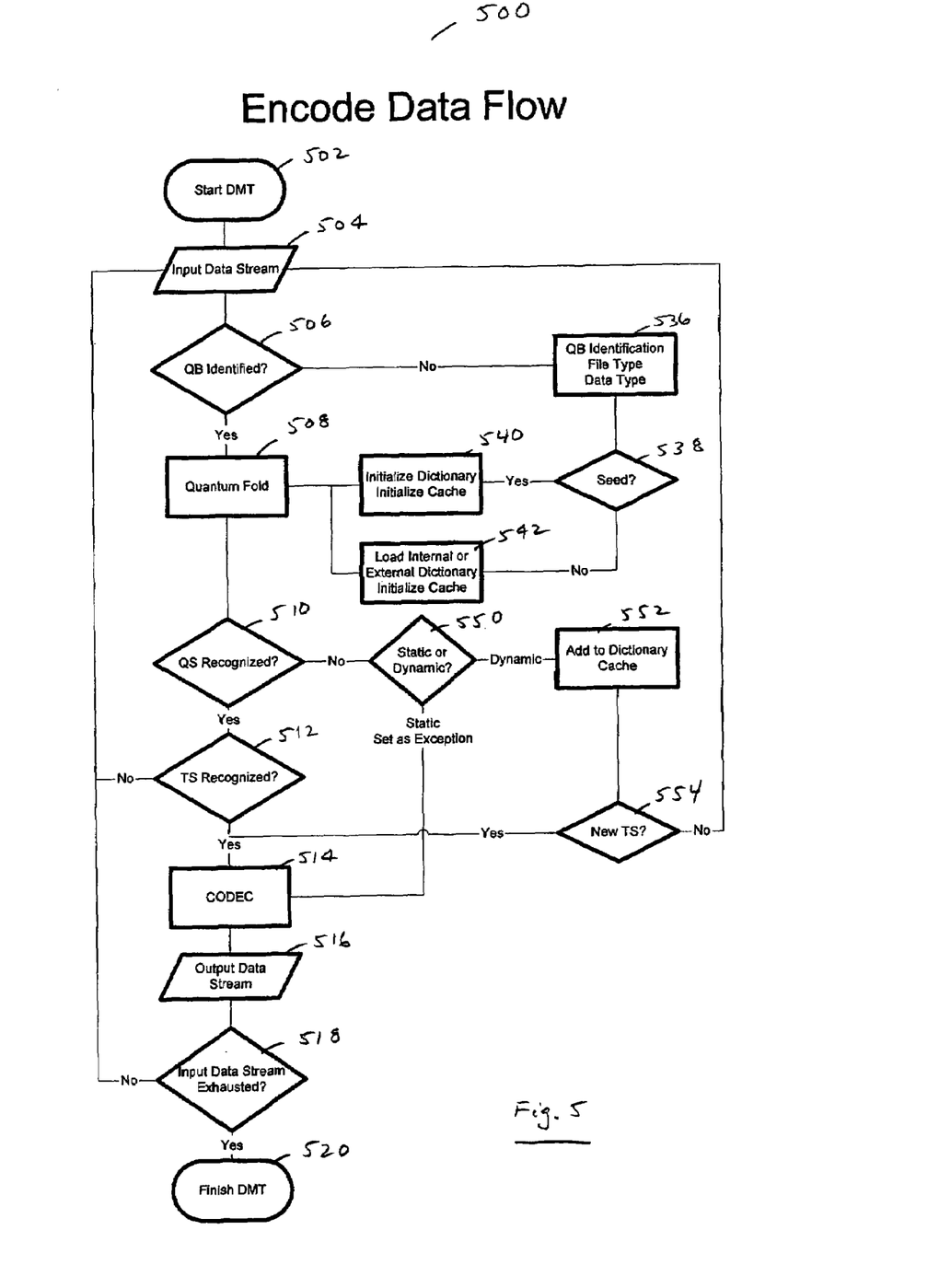
FIG. 5 is an exemplary flow chart of the encoding process in accordance with one embodiment of the present invention.

FIG. 5 is an exemplary flow chart 500 of the encoding process in accordance with one embodiment of the present invention. At 502 the data miniaturization technique ("DMT") is initiated. An input data stream is received as an input (504). Next, an inquiry is made to determine whether a quantum block ("QB") type has been identified (506). If so, a quantum fold operation is conducted to map an existing QB or quantum sequence ("QS") to data. If at 506, a QB type has not yet been identified, then at 536, the QB type is identified for the given file or data type, and at 538 it is determined whether the process requires a seed operation or not. If a seed is required, the dictionary and the cache are initialized (540), and if a seed is not required, an internal or external dictionary is loaded, and the cache is initialized (542), either of which is used to perform the quantum fold process (508). After the quantum fold process 508, it is determined whether a QS has been recognized or not (510), if so, then it is determined whether a terminal sequence ("TS") has been recognized (512), and if not the process loops back to 504. If a TS has been recognized, the data is sent to codec 514, where it is miniaturized, encoded and sent to the output data stream (516). Thereafter, a determination is made as to whether the input data stream has been exhausted (518), and if yes, the process ends (520). If the input data stream is not exhausted, the process loops back to 504. If at 510, a QS is not recognized, a determination is made as to whether to use a dynamic or a static dictionary (550). If a static one, then a quantum exception is set and the process flow continues to the codec 514. On the other hand, if a dynamic one is employed, it is added to the dictionary cache (552), after which a determination is made as to whether a new TS is identified or not (554). If a new TS not is identified, the process flow continues to 504, and if a new TS is identified, the process flow continues to the codec 514.

Figure 6:
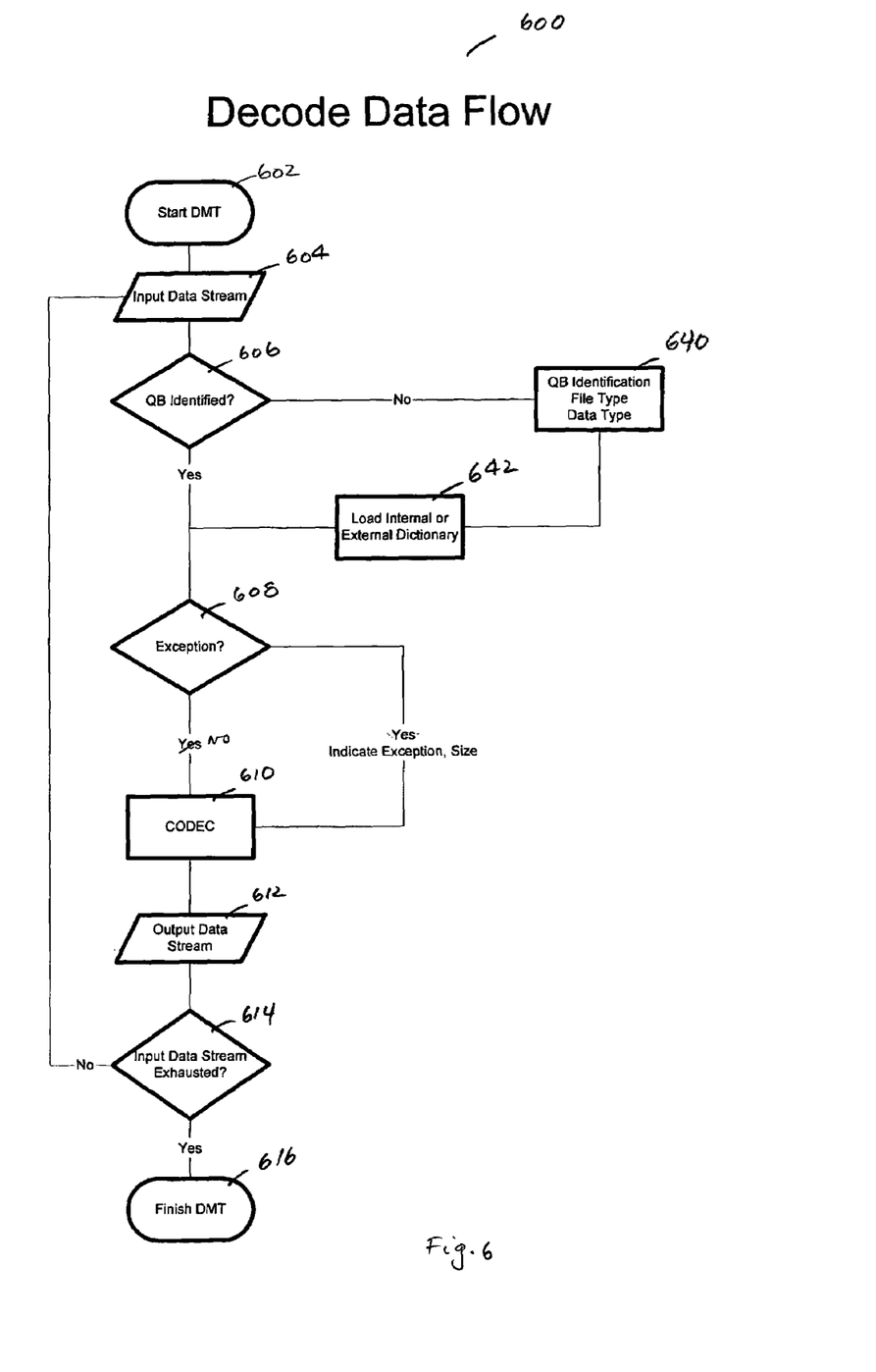
FIG. 6 is an exemplary flow chart of the decoding process in accordance with one embodiment of the present invention.

FIG. 6 is an exemplary flow chart 600 of the decoding process in accordance with one embodiment of the present invention. The process initiates at 602. At 604 an input data stream is received. Next a determination is made as to whether the QB type is identified (606). If not, the data stream is sent to 640 for QB identification depending on the file and/or data type, after which the process flow continues to 642 to load an internal or an external dictionary. A determination is made as to whether a quantum exception is present in the data stream (608). If a quantum exception is noted, the exception's size is determined and it is so indicated and the process continues to the codec 610 for decoding. If no exception is seen in the data stream at (608), the input data stream is sent to the codec 610 for decoding. The codec 610 generated the decoded data stream (612). If the input data stream is exhausted (614) the process is complete (616), and if the input data stream is not exhausted (614), the process flow returns for further processing of the input data stream (604).

Figure 7:
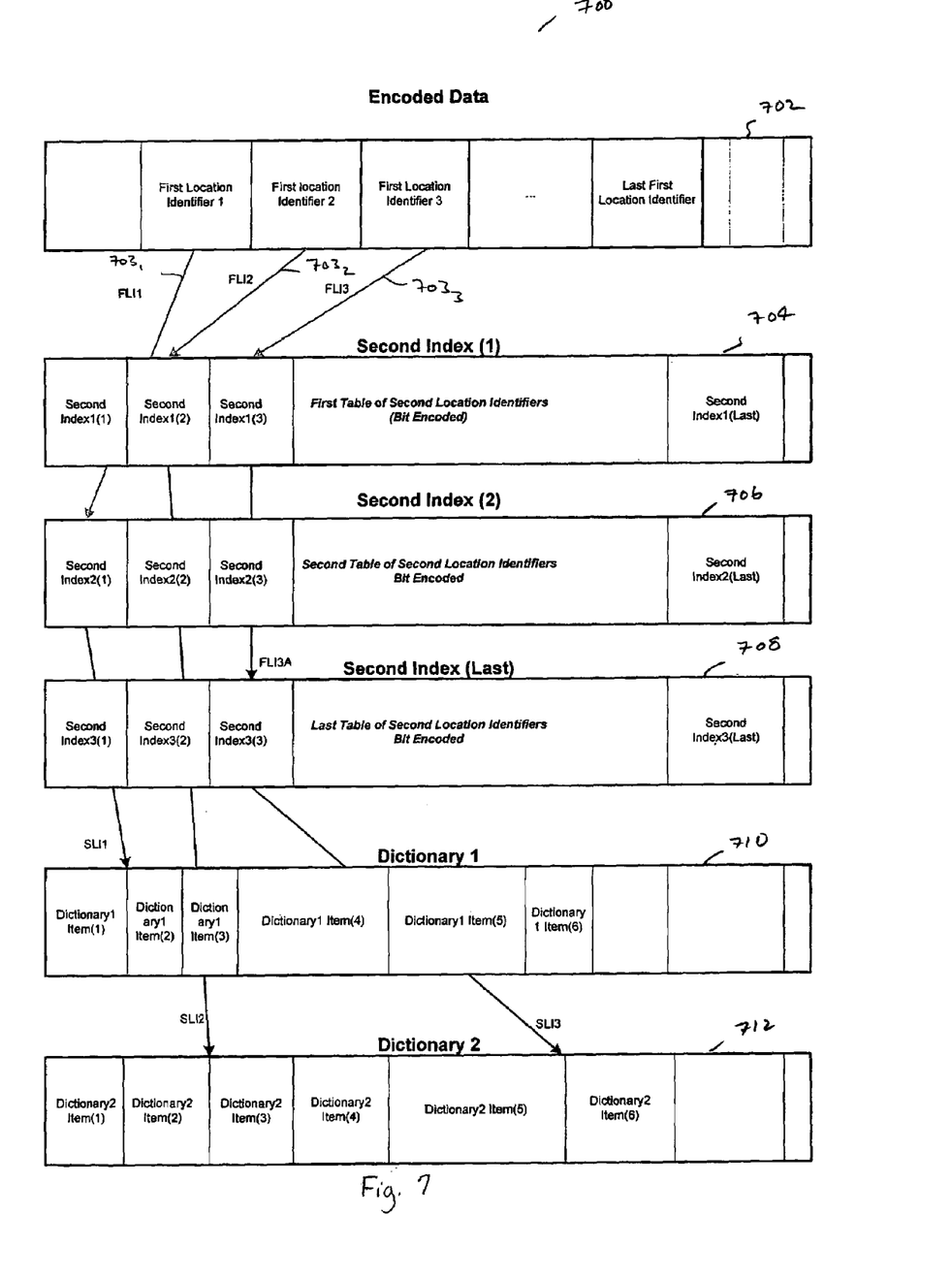
FIG. 7 is an exemplary block diagram of the MDF data structure, in accordance with one embodiment of the present invention.

FIG. 7 is an exemplary block diagram of an MDF data structure, in accordance with one embodiment of the present invention. FIG. 7 shows the relationship between the encoded data 702 having one or more location identifiers, the one or more tables of location identifiers 704–708 having one or more indices, and the one of more dictionaries 710–712 having one or more dictionary items. FIG. 7 also shows how one or more pointers 703-N point from the one or more location identifiers in the encoded data 702 to the one or more indices in the first table of location identifiers. Likewise, various one or more pointers point from tables of location identifiers and the one or more dictionaries. Using this data structure the original data are encoded. The data is miniaturized using a specific terminal sequence dictionary or set of sequence dictionaries. Data is recovered in the context of those dictionaries. The dictionaries themselves are learned in a specific data context, and dictionary elements include both terminal sequence pointers and sequence pointers. Accordingly, the encoded bit size of the MDF data is set by the total number of terminal sequence pointers.

Figure 8:
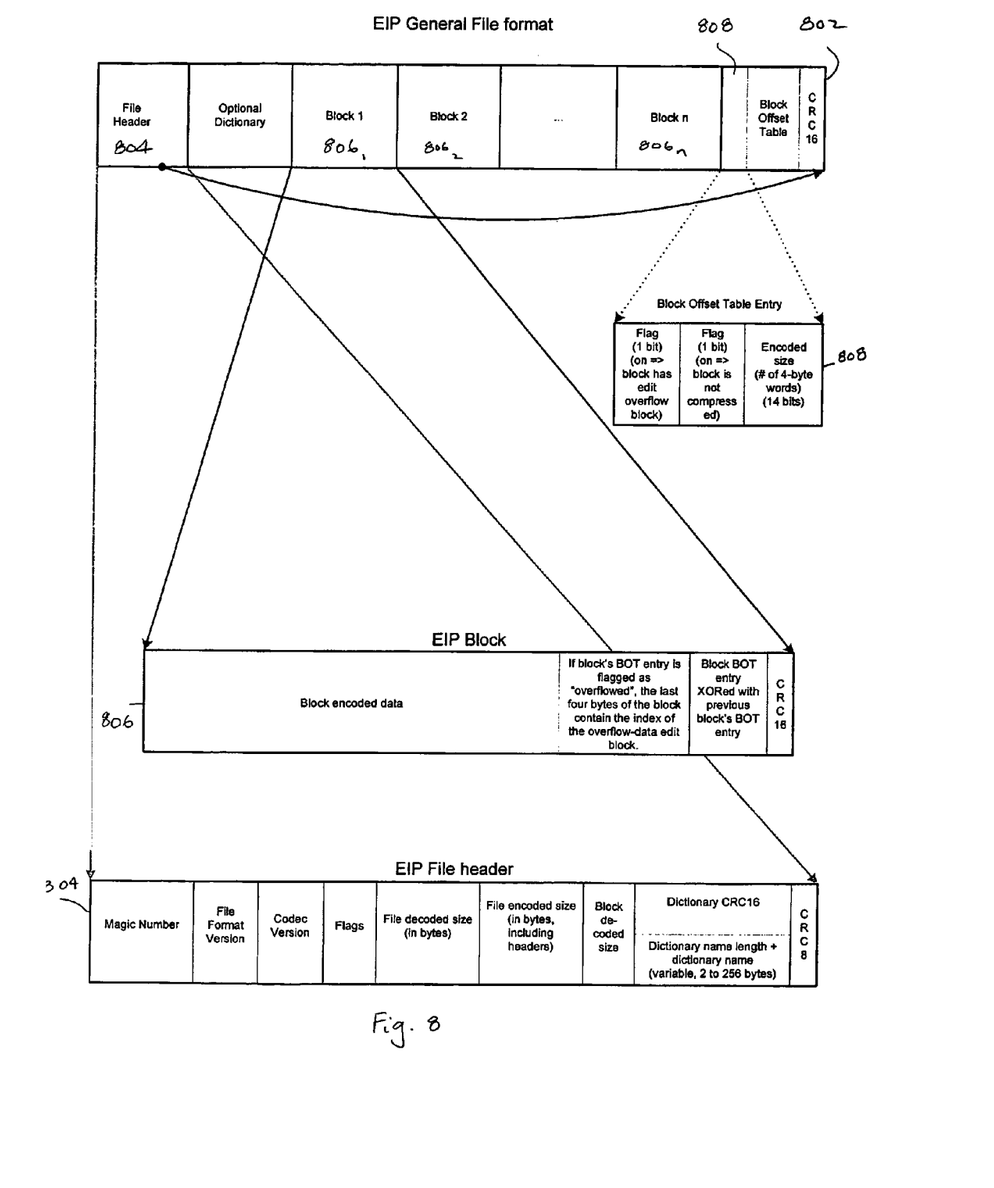
FIG. 8 is an exemplary block diagram of the Edit-in-Place MDF data format, in accordance with one embodiment of the present invention.

FIG. 8 is an exemplary block diagram of the Edit-in-Place MDF data format, in accordance with one embodiment of the present invention. According to this file format, the encoding block size determines the details of the output data format. For example, the encoding block size specifies the size of the input data that is encoded into one output data block. When the data is miniaturized using a small block size then the block overhead may become significant relative to the miniaturized data. As such, different block headers are used for small block sizes (shown in FIG. 10). The data structure 802 shows the Edit-in-Place MDF data format to include a file header 804, an optional dictionary, one or more blocks of data $806_{1-n}$, and a block offset table 808, followed by a CRC ("cyclic redundancy check" bit sequence). The CRC is used to provide a statistical indication that errors have not been introduced into the data to which the CRC applies. The file header itself is shown in further detail to have a format that includes such information as a magic number usable to identify the file as having this particular format, the file format version, codec version, Flags, the file size of both decoded and encoded, and the block size of the decoded data and dictionary information. Further details of a block of data are shown to include the encoded data and various information related to the encoded data's Block Offset Table ("BOT"). For example, when the BOT entry is flagged as overflowed, the last four bytes of the block contain the index of the overflowed-data edit block. In addition, the data structure of a block of encoded data is terminated so that the block's BOT is subjected to an exclusive OR function, to ensure the proper handling of data redundancies.

Figure 9:
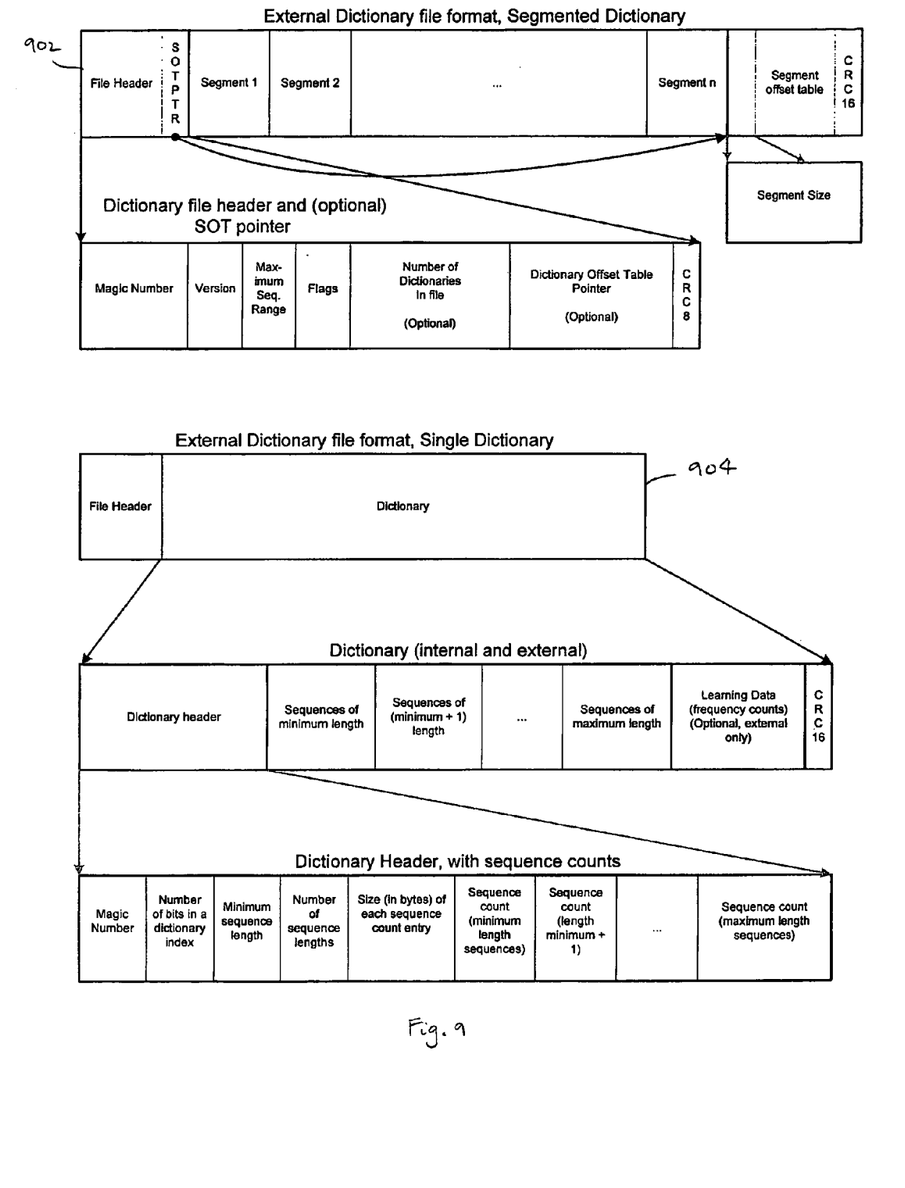
FIG. 9 is an exemplary block diagram of the dictionary headers, in accordance with one embodiment of the present invention.

FIG. 9 is an exemplary block diagram of the dictionary headers, in accordance with one embodiment of the present invention. FIG. 9 shows two different external dictionary formats, namely an external dictionary format for a segmented dictionary 902 and an external dictionary file format for a single dictionary 904. The type and number of dictionaries determines the detail of the output data format. A segmented dictionary file is formatted to include a file header, a segment offset table (SOT) pointer and one or more dictionary segments. The dictionary file header and the optional SOT pointer are formatted to include various pieces of information such as the dictionary version, the maximum sequencer range, flags, and the number of dictionaries in the file (optional) and the dictionary offset table pointer. The SOT is optional because the SOT pointer is not required when there is only one segment of data within the external dictionary. For a single external dictionary 904, the data is structured so that it includes various pieces of information such as the dictionary header, the sequences of data having the minimum length, followed by one or more sequences of data with increasing lengths, and information related to the frequency counts and so on. The dictionary entries are stored in length order. The dictionary header for a single external dictionary includes various pieces of information such as the number of bits in a dictionary index, and the sequence lengths arranged in order of lengths. The type and number of dictionaries determines the detail of the output data format. The encoded data block header specifies if there are several dictionaries, both internal and external involved. Alternatively, a new terminal sequence dictionary can be created using sequence pointers that identify both a specific dictionary and a sequence or subset of sequences inside that dictionary. This new dictionary may draw on multiple source dictionaries. The codec provides a mechanism for encoding terminal sequences that occur across a block boundary such that the integrity of the terminal sequence is maintained. In addition, the codec provides a mechanism for encoding data that does not occur in a terminal sequence dictionary. This data is encoded as quantum blocks.

Figure 10:
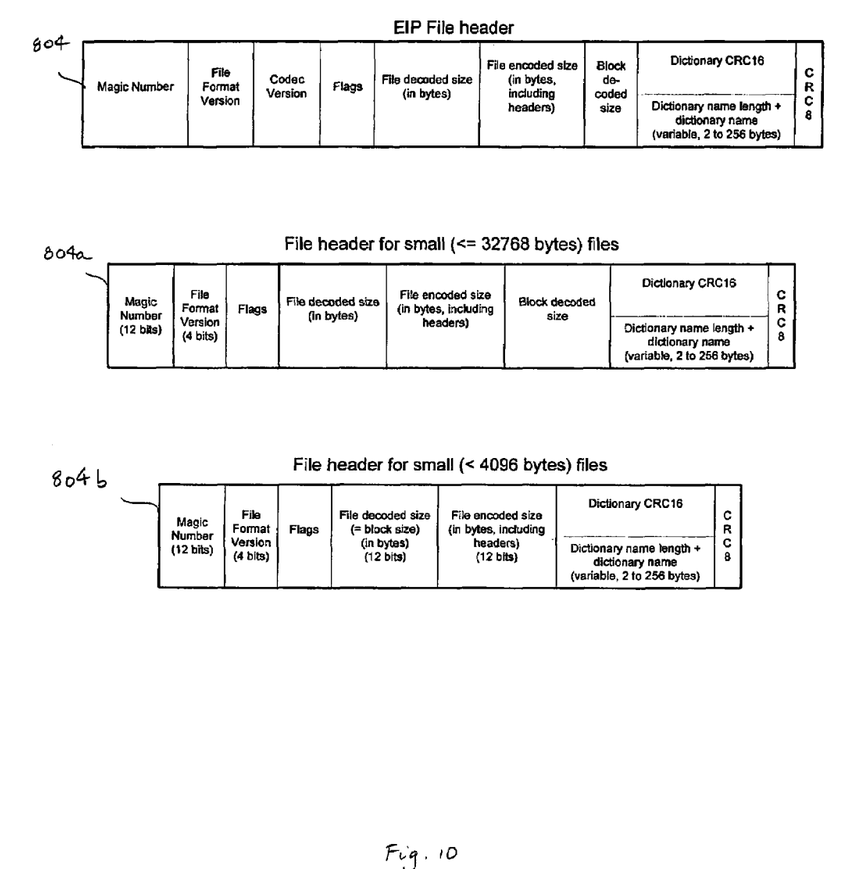
FIG. 10 is an exemplary block diagram of the Edit-in-Place file headers, in accordance with one embodiment of the present invention.

FIG. 10 is an exemplary block diagram of the Edit-in-Place file headers 804, in accordance with one embodiment of the present invention. As described above, the file header has a format that includes such information as a magic number usable to identify the file as having this particular format, the file format version, codec version, Flags, the file size both decoded and encoded, the block size of the decoded data and dictionary information. FIGS. 804*a* and 804*b* show alternative data formats for file header for different size files, so that even more compact data structures are employed for smaller file sizes, in order to reduce unnecessary overhead.

Figure 11:
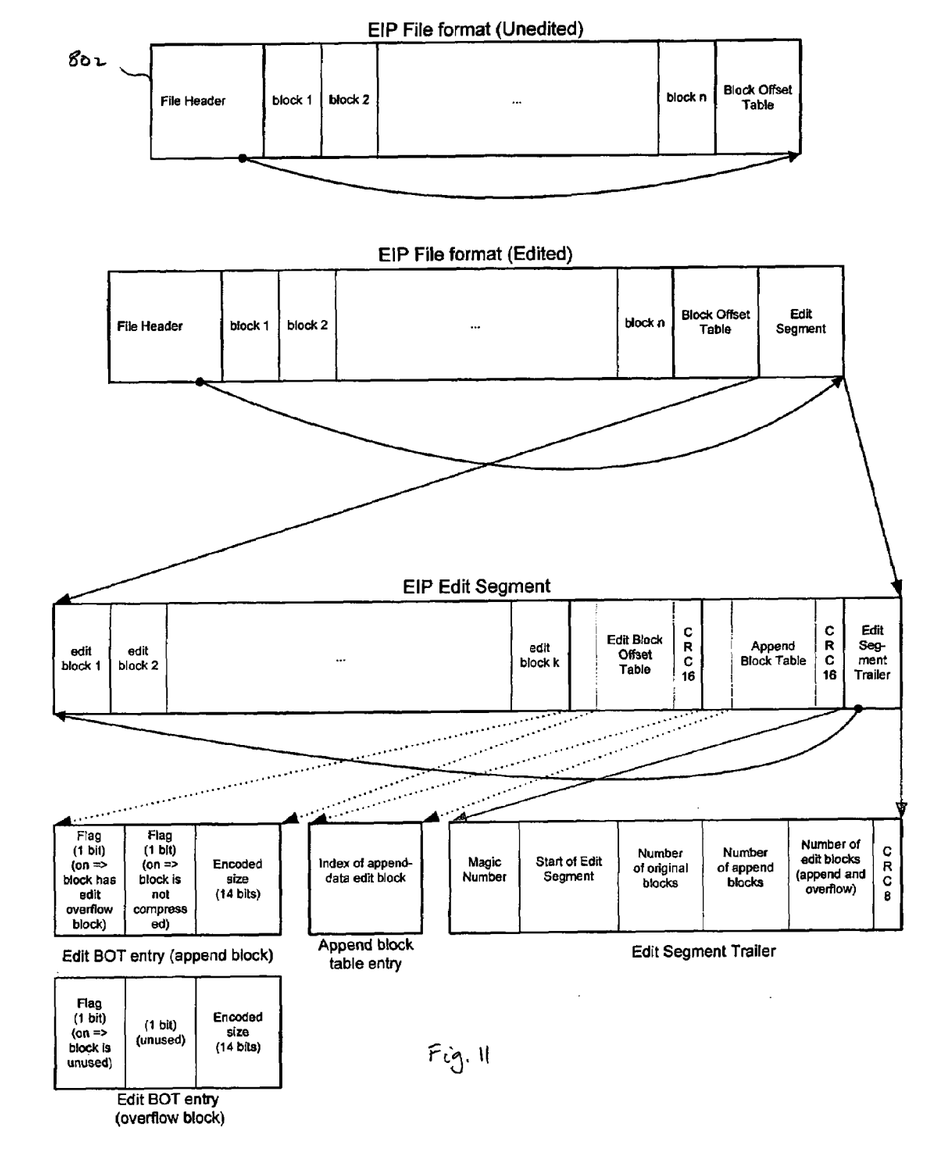
FIG. 11 is an exemplary block diagram of the Edit-in-Place file format, in accordance with one embodiment of the present invention.

FIG. 11 is an exemplary block diagram of the editing format for the Edit-in-Place file format, in accordance with one embodiment of the present invention. Seeking in the MDF file is in terms of the original data offset. Since the miniaturization process has reduced the encoded data size, the data pointer is in terms of the original data offset. Translation of offsets is handled by the codec by organization of the encoding dictionaries according to length. Further, to handle data encoded as quantum blocks, a bitmap of the terminal sequences or quantum block locations is maintained. Seeking is then enabled by calculating the length span of the terminal sequences and the quantum blocks in the encoded file. Seeking granularity is driven by block size and miniaturization ratio.

Searching in the MDF dataset is done using the terminal sequences, quantum sequences or quantum blocks. Search data is first matched to the sequence pointers from the dictionaries associated with the dataset. If none exist then the data is compared literally.

Editing in the MDF dataset is done using the terminal sequences, quantum sequences or quantum blocks. Edit data is first matched to the sequence pointers from the dictionaries associated with the dataset. If none exist then the data is edited literally.

In order to minimize the amount of time required to close the dataset, editing can additionally use an inserted, deleted or modified block mechanism. At some stage, the data will become fragmented. The defragmentation process reads and re-encodes the entire dataset to remove redundant or partially used blocks.

In systems wherein data is encoded as provided above, searching and editing can be provided without requiring decompression. For example, given a compressed file and a sequence of quantum units (e.g., bits, bytes, pixels, symbols, characters, etc.), the sequence can be mapped to a corresponding set of bits (or other storage unit) that represent the sequence in the compressed file. Thus, a compressed file can be searched for the existence of the sequence without requiring decompression by scanning the compressed file for the existence of the corresponding set. For editing involving replacing a sequence to be deleted, the corresponding set for the sequence to be deleted can be determined and located in the compressed file without requiring decompression or changes to other parts of the compressed files (other than possibly length fields or header information, etc.). Likewise, a corresponding set for a sequence to be added can be determined and inserted. In general, editing can be represented by at least one addition, at least one deletion, or a combination of more than one of those. Where the sequence of quantum units includes wildcards, it is also possible to perform these actions, as wildcarded sequences can map to a single corresponding set.

Thus, although the invention has been described with respect to specific embodiments, it will be appreciated that the invention is intended to cover all modifications and equivalents within the scope of the following claims.

What is claimed is:

1. An encoder for encoding an input file into an output file that is compressed wherein the number of bits required to represent the output file is less than the number of bits of the input file, the encoder comprising:

logic for reading data from the input file;

logic to parse the input file into a series of data items, the data items having an order and collectively corresponding to the input file;

logic to compare the series of data items against a static dictionary comprising at least mappings between terminal sequence pointers and representations of data items wherein each mapping has an associated length, the associated length for a mapping being the length of the data item pointed to by its terminal sequence pointer wherein the terminal sequence pointers are represented by a number of bits that is independent of the particular data items in the input file, the static dictionary being static wherein the static dictionary is usable to provide a mapping between a terminal sequence pointer and its corresponding representation of data item independent of mapping of other data items;

logic to add to the output file an output file element that is a terminal sequence pointer for data items that map to entries in the static dictionary, each output file including at least one terminal sequence pointer;

logic to add to the output file an output file element that is a symbol sequence comprising one or more symbols for data items that are to be represented directly in the output file; and logic to create an element mapping for the output file to indicate, for each output file element, whether the output file element corresponds to a terminal sequence pointer or a symbol sequence.

2. The encoder of claim 1, wherein the terminal sequence pointers for a given dictionary are each represented by a number of bits that is the same over all the terminal sequence pointers for the given dictionary.

3. The encoder of claim 2, wherein the number of bits that represent each terminal sequence pointer for given dictionary is represented by a field in a header of the output file.

4. The encoder of claim 1, wherein the logic to compare compares the series of data items against two or more dictionaries, each comprising separate mappings between terminal sequence pointers to an intermediate table of pointers to dictionary entries and representations of data items wherein each mapping has an associated length.

5. The encoder of claim 4, wherein the terminal sequence pointers for at least two of the two or more dictionaries are represented by the same number of bits.

6. The encoder of claim 4, wherein the terminal sequence pointers for each of the two or more dictionaries are represented by a distinct number of bits.

7. The encoder of claim 1, wherein each input file comprises a plurality of symbols, wherein a symbol is a unit of the input file representative of the data contained in the input file.

8. The encoder of claim 7, wherein the symbols are characters when the input file is a text file, the symbols are multi-dimensional pixel color values when the input file is an image file, and the symbols are double-bytes when the input file is a Unicode file.

9. The encoder of claim 1, wherein the number of bits in the output file that represent each symbol in the output file is constant over the output file and is indicated in a header of the output file.

10. The encoder of claim 1, wherein each input file comprises a plurality of symbols, wherein a symbol is a unit of the input file representative of the data contained in the input file and the symbols in the output file, when they appear, are the same bit sequences as bit sequences for the data items in the input file that are represented by the symbols in the output file.

11. The encoder of claim 1, wherein the static dictionary is independent of the input file.

12. The encoder of claim 1, wherein the static dictionary is determined from the input file but is static over an encoding process for the input file.

13. The encoder of claim 1, wherein the static dictionary is incorporated into a header of the output file.

14. The encoder of claim 1, wherein the static dictionary is sorted by associated length of mappings.

15. The encoder of claim 1, wherein the sequence mapping is implemented as a bit map.

16. A method of encoding and editing a file, wherein encoding an input file into the file results in compression wherein the number of bits required to represent the file is less than the number of bits of the input file, the method comprising:

reading data from the input file;

parsing the input file into a series of data items, the data items having an order and collectively corresponding to the input file;

comparing the series of data items against a static dictionary comprising at least mappings between terminal sequence pointers and representations of data items wherein each mapping has an associated length, the associated length for a mapping being the length of the data item pointed to by its terminal sequence pointer wherein the terminal sequence pointers are represented by a number of bits that is independent of the particular data items in the input file, the static dictionary being static wherein the static dictionary is usable to provide a mapping between a terminal sequence pointer and its corresponding representation of data item independent of mapping of other data items;

adding to the file a file element that is a terminal sequence pointer for data items that map to entries in the static dictionary, each file including at least one terminal sequence pointer;

adding to the file a file element that is a symbol sequence comprising one or more symbols for data items that are to be represented directly in the file;

creating an element mapping for the file to indicate, for each file element, whether the file element corresponds to a terminal sequence pointer or a symbol sequence;

obtaining a sequence of quantum units representing an edit to the file;

determining a corresponding set of file elements that represent the sequence in the file;

editing the file by adding or deleting at least one such corresponding set of file elements.

17. The method of claim 16, wherein editing comprises deleting a sequence of quantum units comprising:

determining a deletion corresponding set of file elements that represent the sequence to be deleted in the file;

searching the file for the deletion corresponding set; and removing the deletion corresponding set from the file to the searched location.

18. The method of claim 16, wherein editing comprises adding a sequence of quantum units comprising:

determining an insertion corresponding set of file elements that represent the sequence to be inserted in the file and relative elements relative to which the sequence is to be added;

searching the file for one or more corresponding sets of file elements that represent the relative elements; and inserting the insertion corresponding set of file elements at the searched location of the relative elements.

* * * * *